(12) United States Patent
Yoshimoto et al.

(10) Patent No.: US 10,896,988 B2
(45) Date of Patent: Jan. 19, 2021

(54) LAMINATED SHEET AND SOLAR CELL BACKSHEET USING SAME

(71) Applicant: MITSUI CHEMICALS, INC., Tokyo (JP)

(72) Inventors: Koya Yoshimoto, Chiba (JP); Kiminori Noda, Mobara (JP); Makoto Egawa, Ichihara (JP); Tatsuya Oku, Ichihara (JP)

(73) Assignee: MITSUI CHEMICALS, INC., Tokyo (JP)

( * ) Notice: Subject to any disclaimer, the term of this patent is extended or adjusted under 35 U.S.C. 154(b) by 98 days.

(21) Appl. No.: 16/068,943

(22) PCT Filed: Jan. 12, 2017

(86) PCT No.: PCT/JP2017/000748
§ 371 (c)(1),
(2) Date: Jul. 10, 2018

(87) PCT Pub. No.: WO2017/122713
PCT Pub. Date: Jul. 20, 2017

(65) Prior Publication Data
US 2019/0027626 A1    Jan. 24, 2019

(30) Foreign Application Priority Data
Jan. 13, 2016  (JP) .................... 2016-004500

(51) Int. Cl.
*B32B 27/32* (2006.01)
*H01L 31/049* (2014.01)
(Continued)

(52) U.S. Cl.
CPC ............ *H01L 31/049* (2014.12); *B32B 27/08* (2013.01); *B32B 27/16* (2013.01); *B32B 27/18* (2013.01);
(Continued)

(58) Field of Classification Search
CPC ...... C08L 23/0815; C08L 23/12; C08L 23/16; C08L 2203/204; C08L 23/10;
(Continued)

(56) References Cited

U.S. PATENT DOCUMENTS

2010/0285325 A1    11/2010  Hoya
2014/0011947 A1     1/2014  Kwon et al.
2014/0318616 A1    10/2014  Okuyama et al.

FOREIGN PATENT DOCUMENTS

JP    2004-247390 A    9/2004
JP    2013-022806 A    2/2013
(Continued)

OTHER PUBLICATIONS

International Search Report with English language translation and Written Opinion issued in International Application No. PCT/JP2017/000748 dated Apr. 4, 2017.

*Primary Examiner* — Lawrence D Ferguson
(74) *Attorney, Agent, or Firm* — Foley & Lardner LLP

(57) ABSTRACT

A laminated sheet of a two-layer sheet in which an L1 layer including 50 to 99 parts by mass of an ethylene-based polymer (E1) having a density of 0.890 to 970 kg/m³ and 1 to 50 parts by mass of a propylene-based polymer (P1) is in contact with an L2 layer including 50 to 100 parts by mass of a propylene-based polymer (P2) and 0 to 50 parts by mass of an ethylene-based elastomer (E2) having a density of equal to or more than 850 kg/m³ and less than 890 kg/m³, in which the propylene-based polymer (P1) includes a propylene-based elastomer (P1a) including a propylene-derived constitutional unit and an ethylene-derived constitutional unit and/or a constitutional unit derived from an α-olefin having 4 to 20 carbon atoms, and having a melting point (Tm) that is lower than 120° C. or not observable; and a solar cell backsheet formed using the same.

16 Claims, 1 Drawing Sheet

(51) Int. Cl.
  *B32B 27/36* (2006.01)
  *C08L 23/08* (2006.01)
  *B32B 27/26* (2006.01)
  *B32B 27/22* (2006.01)
  *C08L 23/10* (2006.01)
  *C08L 23/12* (2006.01)
  *C08L 23/14* (2006.01)
  *B32B 27/16* (2006.01)
  *B32B 27/08* (2006.01)
  *B32B 27/18* (2006.01)
  *B32B 27/34* (2006.01)

(52) U.S. Cl.
  CPC .............. *B32B 27/22* (2013.01); *B32B 27/26* (2013.01); *B32B 27/32* (2013.01); *B32B 27/34* (2013.01); *B32B 27/36* (2013.01); *C08L 23/0815* (2013.01); *C08L 23/10* (2013.01); *C08L 23/12* (2013.01); *C08L 23/14* (2013.01); *B32B 2250/02* (2013.01); *B32B 2250/03* (2013.01); *B32B 2250/24* (2013.01); *B32B 2270/00* (2013.01); *B32B 2274/00* (2013.01); *B32B 2307/206* (2013.01); *B32B 2307/21* (2013.01); *B32B 2307/306* (2013.01); *B32B 2307/3065* (2013.01); *B32B 2307/4026* (2013.01); *B32B 2307/416* (2013.01); *B32B 2307/71* (2013.01); *B32B 2457/12* (2013.01); *C08L 2203/204* (2013.01); *Y02E 10/50* (2013.01)

(58) Field of Classification Search
  CPC . C08L 23/14; B32B 2250/02; B32B 2250/03; B32B 2457/12; B32B 27/08; B32B 27/16; B32B 27/18; B32B 27/22; B32B 27/26; B32B 27/32; B32B 27/34; B32B 27/36; B32B 2250/24; B32B 2270/00; B32B 2274/00; B32B 2307/206; B32B 2307/21; B32B 2307/306; B32B 2307/3065; B32B 2307/4026; B32B 2307/416; B32B 2307/71; H01L 31/049; Y02E 10/50
  See application file for complete search history.

(56) References Cited

FOREIGN PATENT DOCUMENTS

| | | |
|---|---|---|
| JP | 2014-509789 A | 4/2014 |
| JP | 2014-091218 A | 5/2014 |
| JP | 2015-228423 A | 12/2015 |
| WO | WO-2009/084517 A1 | 7/2009 |
| WO | WO-2013/051403 A1 | 4/2013 |

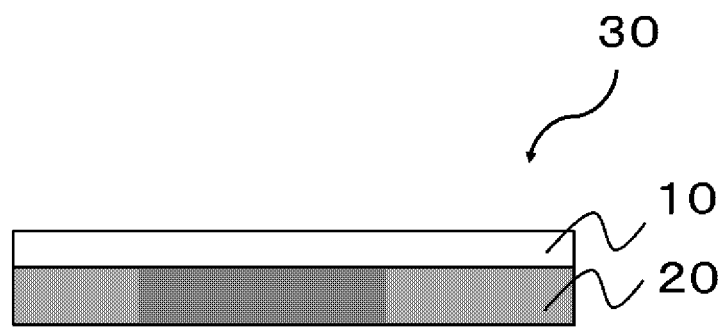

LAMINATED SHEET AND SOLAR CELL BACKSHEET USING SAME

RELATED APPLICATIONS

The present application claims priority under 37 U.S.C. § 371 to International Patent Application No. PCT/JP2017/000748, filed Jan. 12, 2017, which claims priority to and the benefit of Japanese Patent Application No. 2016-004500, filed on Jan. 13, 2016. The contents of these applications are hereby incorporated by reference in their entireties.

TECHNICAL FIELD

The present invention relates to a laminated sheet, and specifically to a laminated sheet having an improved interlayer adhesive strength.

BACKGROUND ART

In recent years, photovoltaic power generation has attracted attention as a semi-permanent and pollution-free next-generation energy source. The photovoltaic power generation is a direct conversion of photovoltaic energy into electrical energy using a solar cell module having a silicon cell semiconductor (solar cell element) incorporated therein. If this solar cell element is directly in contact with outside air, its function is deteriorated. Accordingly, in general, the solar cell element is disposed between a sealing material typified by an ethylene/vinyl acetate copolymer (EVA) or an ethylene/α-olefin copolymer and a transparent surface protective material (mainly glass), and a back side protective material (a backsheet of a polyester resin-based resin, a fluorine resin, or the like), thereby preventing the incorporation of foreign matters, and the intrusion of moisture or the like, together with provision of buffering. Therefore, a backsheet in a solar cell is required to have not only a function of protecting a solar cell element from an external environment (rain, humidity, wind, and the like), but also have various types of performance such as electrical insulating properties, flame retardancy, heat resistance, adhesiveness to a sealing material, and weatherability. In the related art, various materials have been investigated in order to satisfy such performances.

Since a backsheet formed by using a heat-resistant polyester (PET resin) singly as a substrate may have insufficient weatherability or durability in some cases, it has been intended to use a backsheet in which a fluorine resin layer having excellent weatherability (ultraviolet ray-shielding properties) is laminated on one side or both sides of a polyester layer. However, a polyester having a fluorine resin laminated on both sides thereof may not have sufficient adhesiveness between a fluorine resin layer and a sealing material layer in some cases. As a method for improving the adhesiveness, a method in which a fluorine resin layer is coated on a surface opposite to the sealing material layer of the polyester layer, and an easy-adhesion coat layer functioning as a primer is coated on the side of the sealing material layer has been proposed. Further, since the adhesive force between the polyester layer and the fluorine resin layer may not be sufficient in some cases, a method in which a fluorine polymer film obtained by extrusion or casting is laminated on a polyester layer using an adhesive such as a urethane adhesive, or a method in which a fluorine resin solution is coated and dried (for example, PTL 1) is known. However, both of these methods require an extra step, and the management of the steps is also complicated. In addition, if a heat-resistant polyester or a fluorine resin is used, it may be difficult in some cases to provide flame retardancy by the addition of a pigment or a coloring agent or to apply the method to a field in which design is considered important. Therefore, a method of using a polyolefin-based resin which has higher versatility than special resins such as a heat-resistant polyester and a fluorine resin, and has easy recyclability is also disclosed. For example, a backsheet manufactured by using a fine-powdered filler or a coloring agent in combination with a heat-resistant polyolefin-based resin is disclosed (for example, PTL 2 and PTL 3). However, a backsheet comprised of a heat-resistant polyolefin-based resin in the related art may not be necessarily sufficient in the interlayer adhesiveness in some cases.

If a fluorine resin is not used, preferably, a heat-resistant polyester is not used as a substrate layer, and an entire backsheet can be designed using a versatile polyolefin, it is expected that great benefits can be imparted to the industry. That is, there has still been a demand for a backsheet for a solar cell which has excellent durability, weatherability, and adhesive strength to a sealing material layer comprised of a resin such as EVA, and is environmentally friendly and highly cost-effective, the backsheet being formed by using only a versatile polyolefin.

CITATION LIST

Patent Literature

[PTL 1] PCT Japanese Translation Patent Publication No. 2014-509789

[PTL 2] Japanese Patent Application Laid-Open No. 2014-91218

[PTL 3] Japanese Patent Application Laid-Open No. 2004-247390

SUMMARY OF INVENTION

Technical Problem

An object of the present invention is to provide a laminated sheet formed by using a polyolefin-based resin which has excellent durability, weatherability, and interlayer adhesive strength, and is environmentally friendly and highly cost-effective; and a backsheet for a solar cell, formed by using the laminated sheet.

Solution to Problem

The gist of the present invention is as follows.

[1] A laminated sheet comprising a two-layer sheet in which an L1 layer including 50 to 99 parts by mass of an ethylene-based polymer (E1) having a density of 890 to 970 kg/m³ and 1 to 50 parts by mass of a propylene-based polymer (P1) (in which the total of the component (E1) and the component (P1) is 100 parts by mass) is in contact with an L2 layer including 50 to 100 parts by mass of a propylene-based polymer (P2) and 0 to 50 parts by mass of an ethylene-based elastomer (E2) having a density of equal to or more than 850 kg/m³ and less than 890 kg/m³ (in which the total of the component (P2) and the component (E2) is 100 parts by mass), wherein the propylene-based polymer (P1) includes a propylene-based elastomer (P1a) including a propylene-derived constitutional unit and an ethylene-derived constitutional unit and/or a constitutional unit derived from an α-olefin having 4 to 20 carbon atoms, and satisfying the following requirement (a-1).

(a-1) a melting point (Tm) as measured using a differential scanning calorimeter (DSC) is lower than 120° C. or the melting point (Tm) is not observable.

[2] The laminated sheet as described in [1], wherein the L1 layer includes 55 to 95 parts by mass of the ethylene-based polymer (E1) and 5 to 45 parts by mass of the propylene-based polymer (P1).

[3] The laminated sheet as described in [1], wherein the propylene-based elastomer (P1a) satisfies the following requirement (a-2).

(a-2) A melt flow rate (MFR) (230° C., under a load of 2.16 kg) is 0.1 to 500 g/10 min.

[4] The laminated sheet as described in [1], wherein the propylene-based elastomer (P1a) includes 51% to 90% by mole of the propylene-derived constitutional unit.

[5] The laminated sheet as described in [1], wherein the propylene-based elastomer (P1a) includes 7% to 24% by mole of the ethylene-derived constitutional unit.

[6] The laminated sheet as described in [1], wherein the propylene-based elastomer (P1a) includes 0% to 25% by mole of the constitutional unit derived from an α-olefin having 4 to 20 carbon atoms.

[7] The laminated sheet as described in [1], wherein the propylene-based elastomer (P1a) includes a propylene-derived constitutional unit, an ethylene-derived constitutional unit, and a constitutional unit derived from an α-olefin having 4 to 20 carbon atoms.

[8] The laminated sheet as described in [1], wherein the propylene-based polymer (P1) further includes a propylene-based polymer (P1b) satisfying the following requirements (b-1) and (b-2) in combination with the propylene-based elastomer (P1a).

(b-1) a melting point (Tm) as measured by a re-heating method using a differential scanning calorimeter (DSC) is 120° C. to 170° C.

(b-2) a melt flow rate (MFR) (230° C., under a load of 2.16 kg) is 0.1 to 500 g/10 min.

[9] The laminated sheet as described in [1], wherein the L1 layer and/or the L2 layer further include(s) 0.1% to 30% by mass of inorganic particles with respect to the total mass of the respective layers.

[10] The laminated sheet as described in [1], wherein the L1 layer and/or the L2 layer further include(s) 0.005% to 5% by mass of one or more stabilizers selected from the group consisting of an ultraviolet ray absorber, a heat-resistant stabilizer, and a hindered amine type light stabilizer with respect to the total mass of the respective layers.

[11] The laminated sheet as described in [1], wherein an L3 layer including an engineering plastic is in contact with a surface of the L2 layer opposite to the L1 layer.

[12] The laminated sheet as described in [11], wherein the engineering plastic is polyethylene terephthalate, polybutylene terephthalate, or polyamide.

[13] The laminated sheet as described in [1], wherein an L4 layer including a propylene-based polymer (P3) having a melting point (Tm) as measured by differential scanning calorimetry (DSC) of 140° C. to 170° C. is in contact with a surface of the L2 layer opposite to the L1 layer.

[14] The laminated sheet as described in [13], wherein the L4 layer further includes 0.005% to 5% by mass of one or more stabilizers selected from the group consisting of an ultraviolet ray absorber, a heat-resistant stabilizer, and a hindered amine type light stabilizer with respect to the total mass of the L4 layer.

[15] A solar cell backsheet formed by using the laminated sheet as described in [1].

[16] A solar cell formed by using the solar cell backsheet as described in [15].

Advantageous Effects of Invention

The laminated sheet of the present invention has excellent adhesive strength between the layers constituting a two-layer sheet, and excellent heat resistance, as well as excellent adhesiveness to a non-polyolefin-based resin such as EVA and PET. Therefore, it is suitably used as one of various packaging films, or a film for an intermediate layer, in particular, a solar cell backsheet.

BRIEF DESCRIPTION OF DRAWINGS

The FIGURE is a view illustrating a two-layer sheet which is one embodiment of the present invention.

DESCRIPTION OF EMBODIMENTS

Hereinafter, the embodiments of the present invention will be described in detail, appropriately with reference to drawings. Further, an expression, "a numeral value x to a numeral value y" using a preposition "to" positioned between numbers in the specification means a range of equal to or more than x and equal to or less than y.

A term "sheet" refers to, according to the definition in JIS, a thin and flat product, generally with its thickness being small as compared with its length and width, whereas a term "film" refers to a thin and flat product, generally with its thickness being extremely small as compared with its length and width, of which the maximum thickness is limited in a predetermined manner, and the product is typically supplied in a roll shape (The Japanese Industrial Standards JIS K 6900). However, the boundary between the sheet and the film is not clear, and it is not necessary to literally distinguish both the terms in the present invention, and therefore, in the present invention, it should be noted that a product referred to as a "film" also encompasses a "sheet" and a product referred to as the "sheet" also encompasses the "film". In addition, a laminated film and a laminated sheet are also referred to as a "laminate" in some cases.

The laminated sheet of the present invention is a laminated sheet comprising a two-layer sheet in which an L1 layer including 50 to 99 parts by mass of an ethylene-based polymer (E1) having a density of 890 to 970 kg/m$^3$ and 1 to 50 parts by mass of a propylene-based polymer (P1) (in which the total of the component (E1) and the component (P1) is 100 parts by mass) is in contact with an L2 layer including 50 to 100 parts by mass of a propylene-based polymer (P2) and 0 to 50 parts by mass of an ethylene-based elastomer (E2) having a density of equal to or more than 850 kg/m$^3$ and less than 890 kg/m$^3$ (in which the total of the component (P2) and the component (E2) is 100 parts by mass). In the present invention, it is preferable that the component (P1) and the component (P2) are not the same as each other.

The FIGURE is a view illustrating a two-layer sheet which is one embodiment of the present invention. The two-layer sheet 30 shown in the FIGURE is a sheet in which the L1 layer 10 is in contact with the L2 layer 20. This two-layer sheet 30 may further have another layer on one side or both sides thereof.

Examples of a preferred laminated sheet in an embodiment of the present invention include a laminated sheet (a first laminated sheet) in which an L3 layer including an engineering plastic is in contact with a surface of the L2 layer opposite to the L1 layer, and a laminated sheet (a second laminated sheet) in which an L4 layer including a propylene-based polymer (P3) having a melting point (re-heating method) as measured by differential scanning calorimetry (DSC) of 140° C. to 170° C. is in contact with a surface of the L2 layer opposite to the L1 layer.

Hereinafter, the L1 layer, the L2 layer, the L3 layer, the L4 layer, various additives which may be contained in a predetermined manner in each of the layers, and a laminated sheet comprised of these layers will be described in this order in detail.

<L1 Layer>

The L1 layer includes 50 to 99 parts by mass of an ethylene-based polymer (E1) and 1 to 50 parts by mass of a propylene-based polymer (P1), preferably 55 to 95 parts by mass of an ethylene-based polymer (E1) and 5 to 45 parts by mass of a propylene-based polymer (P1), and more preferably 55 to 90 parts by mass of an ethylene-based polymer (E1) and 10 to 45 parts by mass of a propylene-based polymer (P1). Here, the total of the component (E1) and the component (P1) is 100 parts by mass.

The density of the ethylene-based polymer (E1) included in the L1 layer is 890 to 970 kg/m$^3$, preferably 890 to 950 kg/m$^3$, more preferably 890 to 930 kg/m$^3$, and particularly preferably 890 to 920 kg/m$^3$. If the density of this ethylene-based polymer (E1) is too low, a problem in that the material strength of the L1 layer is lower than the interlayer strength, leading to cohesive failure, may occur in some cases. The ethylene-based polymer (E1) may be an ethylene homopolymer constituted only with an ethylene-derived constitutional unit or may be a copolymer comprised of equal to or more than 70% by mole of an ethylene-derived constitutional unit and equal to or less than 30% by mole of a constitutional unit derived from an α-olefin having 3 to 10 carbon atoms. The melt flow rate (MFR) of the ethylene-based polymer (E1) as measured at 190° C. under a load of 2.16 kg is usually 0.1 to 30 g/10 min, and preferably 0.5 to 20 g/10 min.

The propylene-based polymer (P1) included in the L1 layer is not particularly limited as long as it includes a propylene-based elastomer (P1a) satisfying the following requirement (a-1). The melting point (Tm) in the requirement (a-1) of the propylene-based elastomer (P1a) is a value as measured according to a general method in Examples which will be described later. If the melting point (Tm) of the propylene-based elastomer (P1a) is equal to or higher than 120° C., a problem in that the interfacial strength with the ethylene-based polymer (E1) is lowered, leading to cohesive failure of the L1 layer, may occur in some cases. Further, it is preferable that the propylene-based elastomer (P1a) also satisfies the following requirement (a-2).

(a-1) A melting point (Tm) as measured using a differential scanning calorimeter (DSC) is lower than 120° C. or the melting point (Tm) is not observable.

(a-2) A melt flow rate (MFR) (230° C., under a load of 2.16 kg) is 0.1 to 500 g/10 min.

The propylene-based elastomer (P1a) is a propylene-based copolymer including a propylene-derived constitutional unit and an ethylene-derived constitutional unit and/or a constitutional unit derived from an α-olefin having 4 to 20 carbon atoms, and preferably a propylene-based copolymer including a propylene-derived constitutional unit, an ethylene-derived constitutional unit, and a constitutional unit derived from an α-olefin having 4 to 20 carbon atoms. The propylene-based elastomer (P1a) may be, for example, any one of a propylene/ethylene copolymer, a copolymer of propylene/α-olefin having 4 to 20 carbon atoms, and a copolymer of propylene/ethylene/α-olefin having 4 to 20 carbon atoms. Specific examples of the α-olefin having 4 to 20 carbon atoms include 1-butene, 1-pentene, 3-methyl-1-butene, 1-hexene, 4-methyl-1-pentene, 1-octene, and 1-decene. These α-olefins are used alone or in combination of two or more kinds thereof.

The proportion of the propylene-derived constitutional unit in the propylene-based elastomer (P1a) is usually 51% to 90% by mole, preferably 60% to 89% by mole, more preferably 62% to 88% by mole, and particularly preferably 62% to 86% by mole.

The proportion of the ethylene-derived constitutional unit in the propylene-based elastomer (P1a) is usually 0% to 24% by mole, preferably 7% to 24% by mole, more preferably 8% to 22% by mole, particularly preferably 8% to 20% by mole, and most preferably 8% to 18% by mole.

The proportion of the constitutional unit derived from an α-olefin having 4 to 20 carbon atoms in the propylene-based elastomer (P1a) is usually 0% to 25% by mole, more preferably 0% to 24% by mole, particularly preferably 1 to 23% by mole, and most preferably 2% to 23% by mole.

The respective proportions of the above-mentioned constitutional units in the propylene-based elastomer (P1a) are the proportions in a case where the total of the propylene-derived constitutional unit, the ethylene-derived constitutional unit, and the constitutional unit derived from an α-olefin having 4 to 20 carbon atoms is taken as 100% by mole.

In the present invention, since the above-mentioned propylene-based elastomer (P1a) is included in the L1 layer having the ethylene-based polymer (E1) as a main component, the adhesive strength between the L1 layer and the L2 layer having the propylene-based polymer (P2) as a main component is improved.

It is preferable that the propylene-based polymer (P1) included in the L1 layer further includes a propylene-based polymer (P1b) satisfying the following requirements (b-1) and (b-2) in combination with the propylene-based elastomer (P1a). The melting point (Tm) in the requirement (b-1) of the propylene-based polymer (P1b) is a value as measured according to a re-heating method in Examples which will be described later.

(b-1) A melting point (Tm) as measured by a re-heating method using a differential scanning calorimeter (DSC) is 120° C. to 170° C.

(b-2) A melt flow rate (MFR) (230° C., under a load of 2.16 kg) is 0.1 to 500 g/10 min.

The propylene-based polymer (P1b) may be any one of a homopolypropylene, a random copolymer of propylene/α-olefin having 2 to 20 carbon atoms (provided that propylene is excluded), and a propylene block copolymer as long as it satisfies the requirements (b-1) and (b-2). The propylene-based polymer (P1b) is preferably a homopolypropylene or a random copolymer of propylene/α-olefin having 2 to 20 carbon atoms (provided that propylene is excluded). Specific examples of the α-olefin having 2 to 20 carbon atoms excluding propylene include ethylene, 1-butene, 1-pentene, 3-methyl-1-butene, 1-hexene, 4-methyl-1-pentene, 1-octene, and 1-decene. In a case where the propylene-based polymer (P1b) is a random copolymer of propylene/α-olefin having 2 to 20 carbon atoms (provided that propylene is excluded), the proportion of the constitutional unit derived from an α-olefin having 2 to 20 carbon atoms is usually 0.1% to 8% by mole, preferably 0.2% to 7.5% by mole, and more preferably 0.3% to 7% by mole.

The propylene-based polymer (P1) included in the L1 layer includes at least the above-mentioned propylene-based elastomer (P1a), also preferably further includes the propylene-based polymer (P1b), and as desired, may include other propylene-based polymers. For example, a propylene-based resin composition including 40 to 100 parts by mass, preferably 50 to 99 parts by mass, and more preferably 60 to 95 parts by mass of the propylene-based elastomer (P1a), and 0 to 60 parts by mass, preferably 1 to 50 parts by mass, and more preferably 5 to 40 parts by mass of the propylene-based polymer (P1b) (in which the total of the component (P1a) and the component (P1b) is 100 parts by mass) can be suitably used as the propylene-based polymer (P1).

The steric structure of the propylene-based elastomer (P1a) and the propylene-based polymer (P1b) may be an isotactic structure or a syndiotactic structure, in terms of the performance of the laminated sheet. However, from the viewpoints of the easiness in production of a polymer and the availability in a case of using a commercially available product, it is preferable that the steric structure is an isotactic structure.

<L2 Layer>

The L2 layer includes 50 to 100 parts by mass of the propylene-based polymer (P2) and 0 to 50 parts by mass of the ethylene-based elastomer (E2), preferably 51 to 100 parts by mass of the propylene-based polymer (P2) and 0 to 49 parts by mass of the ethylene-based elastomer (E2), and more preferably 55 to 100 parts by mass of the propylene-based polymer (P2) and 0 to 45 parts by mass of the ethylene-based elastomer (E2). Here, the total of the component (P2) and the component (E2) is 100 parts by mass.

A particularly preferred L2 layer includes the ethylene-based elastomer (E2), whose content is usually 1% to 45% by mass, and preferably 5% to 45% by mass, with respect to the entire L2 layer. In a case where the ethylene-based elastomer (E2) is included in the L2 layer having the propylene-based polymer (P2) as a main component, the adhesive strength between the L2 layer and the L1 layer having the ethylene-based polymer (E1) as a main component is further improved.

The melting point (re-heating method) of the propylene-based polymer (P2) included in the L2 layer as measured by a general method which will be described later, using the differential scanning calorimetry (DSC), is usually 120° C. to 170° C., and preferably 130° C. to 160° C. As such a propylene-based polymer (P2), the propylene-based polymer (P1b) described above can be used without limitation. The propylene-based polymer (P2) may be the same as or different from the propylene-based polymer (P1b) which can be used as the propylene-based polymer (P1) of the L1 layer as described above.

The density of the ethylene-based elastomer (E2) included in the L2 layer is equal to or more than 850 kg/m$^3$ and less than 890 kg/m$^3$. Further, the melt flow rate (190° C., under a load of 2.16 kg) of the ethylene-based elastomer (E2) is preferably 0.1 to 20 g/10 min.

The ethylene-based elastomer (E2) is preferably an ethylene-based copolymer including an ethylene-derived constitutional unit and a constitutional unit derived from an α-olefin having 3 to 20 carbon atoms. Specific examples of the α-olefin having 3 to 20 carbon atoms include propylene, 1-butene, 1-pentene, 1-hexene, 1-heptene, 1-octene, 1-nonene, 1-decene, 1-undecene, 1-dodecene, 1-hexadecene, 1-octadecene, 1-nonadecene, 1-eicosene, and 4-methyl-1-pentene. Among those, an α-olefin having 3 to 10 carbon atoms is preferable, and an α-olefin having 4 to 8 carbon atoms is more preferable. In particular, propylene, 1-butene, 4-methyl-1-pentene, 1-hexene, and 1-octene are preferable. These α-olefins may be used alone or in combination of two or more kinds thereof.

In the ethylene-based elastomer (E2), the proportion of the ethylene-derived constitutional unit is preferably 80% to 95% by mole, and the proportion of the constitutional unit derived from an α-olefin having 3 to 20 carbon atoms is preferably 5% to 20% by mole. These proportions are the proportions in a case where the total of the ethylene-derived constitutional unit and the constitutional unit derived from an α-olefin having 3 to 20 carbon atoms is taken as 100% by mole.

<L3 Layer>

In a first laminated sheet which is one of preferred embodiments of the present invention, the L3 layer including an engineering plastic is in contact with a surface of the L2 layer opposite to the L1 layer.

The engineering plastic is a resin selected from the group consisting of an acryl-based polymer, a vinyl chloride-based polymer, a vinylidene chloride-based polymer, an aromatic vinyl-based polymer, polyethylene terephthalate, polybutylene terephthalate, polyamide, polycarbonate, polyacetal, polyphenylene ether, polysulfone, polyethersulfone, polyphenylene sulfide, polyarylate, polyamide-imide, polyether ether ketone, polyimide, and liquid crystal polyester. Among these, a polyester-based resin such as polyethylene terephthalate and polybutylene terephthalate, and a polyamide-based resin are preferable from the viewpoint of performance such as wet heat resistance and processability, and in terms of economic efficiency or availability.

<L4 Layer>

In a second laminated sheet which is one of preferred embodiments of the present invention, the L4 layer including a propylene-based polymer (P3) having a melting point (re-heating method) as measured by differential scanning calorimetry (DSC) of 140° C. to 170° C. is in contact with a surface of the L2 layer opposite to the L1 layer.

It is preferable that the melting point (re-heating method) of the propylene-based polymer (P3) is 140° C. to 170° C., and exhibits a melting point which is higher by equal to or more than 5° C., and preferably equal to or more than 10° C. than the melting point (Tm) of the propylene-based polymer (P1b) or the propylene-based polymer (P2). Such a propylene-based polymer (P3) is preferably a propylene homopolymer. It can be easily prepared by, for example, a catalyst having a known magnesium-supported titanium catalyst in combination with a specific donor, or a metallocene catalyst comprised of a transition metal complex comprised of a cyclopentadienyl-fluorenyl ligand having a specific structure described in International Publication No. 2005/19283, and a co-catalyst. In addition, the propylene-based polymer (P3) may be referred to as a high-melting point propylene-based polymer in some cases in the following description.

<Various Additives>

The L1 layer and/or the L2 layer, and preferably only the L1 layer, or the L1 layer and L2 layer may include 0.1% to 30% by mass of inorganic particles with respect to the total mass of the respective layers.

As the inorganic particles, for example, particles having an ultraviolet ray-absorbing ability, particles having a large difference in a refractive index from a polyolefin-based resin which is a main constituent of the L1 layer and the L2 layer, particles having electrical conductivity, flame-retardant particles, or a pigment can be used. By the use of the particles, for example, optical properties such as ultraviolet light resistance, light reflectivity, and whiteness, and antistatic properties can be imparted. The inorganic particles refer to those having a primary particle diameter of equal to or more than 5 nm based on the diameter of a projected equivalent circle. The average particle size of the inorganic particles is preferably 0.1 to 30 μm. If the average particle size is less than 0.1 μm, the reflectivity of sun light may not be sufficient in some cases, whereas if the average particle size is more than 30 μm, the adhesive force of the polyolefin-based resin may be inhibited in some cases.

Specific examples of the inorganic particles include metals such as gold, silver, copper, platinum, palladium, rhenium, vanadium, osmium, cobalt, iron, zinc, ruthenium, praseodymium, chromium, nickel, aluminum, tin, titanium, tantalum, zirconium, antimony, indium, yttrium, and lanthanum; metal oxides such as zinc oxide, titanium oxide, cesium oxide, antimony oxide, tin oxide, indium tin oxide, yttrium oxide, lanthanum oxide, zirconium oxide, aluminum oxide, and silicon oxide; metal hydroxides such as aluminum hydroxide, synthetic magnesium hydroxide, natural magnesium, calcium hydroxide, and barium hydroxide; metal fluorides such as lithium fluoride, magnesium fluoride, aluminum fluoride, and cryolite; metal phosphates such as calcium phosphate; carbonates such as calcium carbonate; sulfates such as barium sulfate; and silicates such as talc, kaolin, and mica. These inorganic particles may be mixed and used.

In a case where the laminated sheet of the present invention is applied to a solar cell backsheet, in consideration of a fact that solar cells are used outdoors in many cases, an effect of reducing of a decrease in elongation or coloration due to deterioration of a sheet over a long period of time can be exhibited by utilizing the ultraviolet resistance caused by the inorganic particles, which is preferable, in a case where metal oxides having an ultraviolet ray-absorbing ability, such as titanium oxide, zinc oxide, and cerium oxide are used as the inorganic particles. Thus, such the application is preferable. In addition, it is more preferable to use titanium oxide as the inorganic particles in a view that high reflection characteristics can be imparted, and it is still more preferable to use a rutile-type titanium oxide in a view that ultraviolet ray resistance is higher.

In the present invention, a known antioxidant, a heat-resistant stabilizer, a dye, a neutralizing agent, a discoloration inhibitor, a lubricant, an antiblocking agent, a plasticizer, a foaming agent, a foaming aid, a crosslinking agent, a crosslinking aid, a stabilizer, a crystal nucleating agent, an ultraviolet ray absorber, a hindered amine-based light stabilizer, a filler, and an elastomer that imparts flexibility, which is to be blended with a thermoplastic resin-based film, may be contained in the L1 layer, the L2 layer, the L3 layer, or the L4 layer, as desired, within a range not impairing the effects of the present invention. Preferably, one or more stabilizers selected from the group consisting of an ultraviolet ray absorber, a heat-resistant stabilizer, and a hindered amine-type light stabilizer is included. In a case of using an additive, the addition amount thereof is usually 0.005 to 5 parts by mass, and preferably 0.01 to 3 parts by mass, with respect to the total mass of the respective layers.

<Laminated Sheet>

As described above, the laminated sheet of the present invention is a laminated sheet including, as an essential constituent sheet, a two-layer sheet in which the L1 layer is in contact with the L2 layer. In a case where the laminated sheet of the present invention is used as a solar cell backsheet, for example, a configuration in which a surface of the L1 layer opposite to the L2 layer is adjacent to a sealing material layer comprised of a resin such as EVA, that is, a configuration of sealing material layer/L1 layer/L2 layer is adopted. The "contact" in the present invention means a bonded structure for making contacts, and a significant adhesive force is usually accompanied between the faces to be in contact.

Examples of the preferred laminated sheet of the present invention include a first laminated sheet having a layer configuration in which the L3 layer is in contact with a surface of the L2 layer opposite to the L1 layer, that is, a layer configuration of L1 layer/L2 layer/L3 layer, and a second laminated sheet having a layer configuration in which the L4 layer is contact with a surface of the L2 layer opposite to the L1 layer, that is, a layer configuration of L1 layer/L2 layer/L4 layer In the present invention, the thickness ratio of the L1 layer to the L2 layer (L1 layer:L2 layer) is usually 10:90 to 90:10, preferably 20:80 to 80:20, and more preferably 30:70 to 70:30. The total thickness of the two-layer sheet in which the L1 layer is in contact with the L2 layer is usually 20 to 800 μm, and preferably 50 to 500 μm. The thickness of the L3 layer in the first laminated sheet is usually 10 to 1,000 μm, and preferably 50 to 500 μm. The thickness of the L4 layer in the second laminated sheet is usually 10 to 2,000 μm, and preferably 50 to 1,000 μm.

Next, a method for producing the laminated sheet of the present invention will be described by way of example. A method for laminating the L1 layer, the L2 layer, and as desired, the L3 layer or the L4 layer in the laminated sheet of the present invention, for example, a method for performing processing into a sheet, including a step in which a raw material for an L1 layer, having an ethylene-based polymer as a main constituent, a raw material for an L2 layer, having a propylene-based polymer as a main constituent, and as desired, a raw material for an L3 layer, having an engineering plastic as a main constituent, and a raw material for an L4 layer, having a high-melting point propylene-based polymer as a main constituent are respectively supplied to different extruders, and respectively melted, and then the L1 layer, L2 layer, and as desired, the L3 layer or the L4 layer are combined and laminated in this order, and extruded into a sheet shape from a T die (coextrusion method), a method in which a raw material for a coating layer is introduced and melt-extruded in an extruder to be extruded from the nozzle onto a sheet which has been prepared as a single layer, while performing lamination (melt-lamination method), a method in which the respective films are prepared individually and thermally pressed by a group of overheated rolls or the like (thermal lamination method), a method in which materials are dissolved in a solvent, and the solution is coated and dried (coating method), and a method formed by a combination thereof can be used without limitation. Out of these methods, the coextrusion method is preferable in a view that the production step takes a short time and the interlayer adhesiveness is good.

For example, in a case where a two-layer sheet comprised of the L1 layer and the L2 layer is prepared by the coextrusion method, the raw material for the L1 layer and the raw material for the L2 layer are respectively supplied to different extruders, and respectively fused. Then, the L1 layer and the L2 layer are combined and laminated in this order, using a member or device such as a multi-manifold die, a feed block, a static mixer, and a pinhole, and coextruded from a T-die into a sheet shape. If the melt viscosity difference of the respective layers is large, it is preferable to use a multi-manifold die from the viewpoint of suppression of lamination unevenness. Further, the laminated sheet of the present invention can be obtained by extruding, cooling, and solidifying the laminated sheet discharged from the T-die on a cooling body such as a casting drum.

The obtained laminated sheet of the present invention may be subjected to a processing treatment such as a heat treatment and aging, as desired, within a range not impairing the effects of the present invention. By performing the heat treatment, the thermal dimension stability of the laminated sheet of the present invention can be improved. Incidentally, a corona treatment and a plasma treatment may be carried out in order to improve the adhesiveness of the laminated sheet.

In the laminated sheet of the present invention, it is thought that since the L1 layer and the L2 layer are both constituted with an ethylene-based polymer and a propylene-based polymer, the laminated sheet has a surface structure in which the surfaces of both the layers easily exhibit a high adhesive force.

In the second laminated sheet having the L4 layer adjacent to the L2 layer, it is thought that since the L2 layer and the L4 layer both contain a propylene-based polymer, the laminated sheet exhibits a high adhesive force for the same reason.

In the first laminated sheet having the L3 layer adjacent to the L2 layer, in a case where a versatile PET resin is used as the L3 layer, it is preferable to laminate the L2 layer and the L3 layer by a method such as a dry lamination method. Since the L2 layer and the L3 layer both have an ethylene-derived skeleton, it is expected to obtain a laminate having excellent compatibility.

As described above, in a case where the laminated sheet of the present invention is used as a solar cell backsheet, the surface of the L1 layer opposite to the L2 layer is adjacent to the sealing material layer, that is, the laminated sheet takes a configuration of sealing material layer/L1 layer/L2 layer. In the related art, an ethylene/vinyl acetate copolymer (EVA) or an ethylene/α-olefin copolymer, which is a polymer having an ethylene-derived skeleton, has been mainly used as a raw material resin for a sealing material layer. In the present invention, it is thought that since the L1 layer has an ethylene-based polymer as a main constituent, the adhesive force between the sealing material layer and the L1 layer is remarkably improved.

EXAMPLES

Hereinafter, the embodiments of the present invention will be described in more detail through the comparison between Examples and Comparative Examples. The following Examples are provided to make the present invention better understood, and the technical scope of the present invention is not limited thereto.

<Method for Analyzing Raw Materials Used>
(1) Density: The density was measured at 23° C. in accordance with ASTM D1505.
(2) Melt Flow Rate (MFR): The melt flow rate was measured under the conditions of 190° C. or 230° C., and a load of 2.16 kg in accordance with ASTM D1238.
(3) Melting Point (general method): A DSC curve obtained by cooling a test piece, which has been subjected to a state control at 23° C.±2° C. for 72 hours or more to −40° C., and then performing measurements under the condition of a heating rate of 10° C./min was created. A fusion peak temperature obtained herein was taken as a melting point (general method).
(4) Melting Point (Re-Heating Method): A DSC curve obtained by keeping a test piece at 200° C. for 10 min in a DSC measurement apparatus, then cooling to −20° C. at a temperature lowering rate of 10° C./min, keeping it at −20° C. for 1 min, and performing a measurement again under the condition of a heating rate of 10° C./min was created. A fusion peak obtained herein was taken as a melting point (re-heating method).

<Availability or Preparation Method for Raw Materials Used>
(1) Ethylene-Based Polymer
Ethylene Polymer, EVOLUE™ SP2040 (manufactured by Prime Polymer Co., Ltd., ethylene/1-hexene copolymer, density: 918 kg/m$^3$, MFR under 190° C.: 3.8 g/10 min)
EVOLUE™ SP1540 (manufactured by Prime Polymer Co. Ltd., ethylene/1-hexene copolymer, density: 913 kg/m$^3$, MFR under 190° C.: 3.8 g/10 min)
TAFMER™ A-4085S (manufactured by Mitsui Chemicals Co., Ltd., ethylene-1-butene copolymer, 1-butene content: 11% by mole, density: 885 kg/m$^3$, MFR under 190° C.: 3.6 g/10 min)
(2) Propylene-Based Polymer
PRIME POLYPRO™ F107 (manufactured by Prime Polymer Co., Ltd., propylene homopolymer, density: 900 kg/m$^3$, MFR under 230° C.: 7.0 g/10 min, melting point (re-heating method): 165° C.)
A propylene-based polymer composition was prepared by the same method as in Example 2 of International Publication No. 2009/84517 filed by the present applicant. As a result, a propylene-based polymer composition comprised of 10% by mass of a propylene homopolymer (corresponding to a propylene-based polymer (P1b)) having a melting point (re-heating method) of 160° C. and an MFR under 230° C. of 7.1 g/10 min, and 90% by mass of a propylene/ethylene/1-butene copolymer (corresponding to a propylene-based elastomer (P1a)) having a content of a propylene-derived skeleton of 78% by mole, a content of an ethylene-derived skeleton of 16% by mole, and a content of a 1-butene-derived skeleton of 6% by mole, having a melting point (general method) that is not observable, and having an MFR under 230° C. of 6.6 g/10 min was obtained. Hereinafter, this composition is simply referred to as a "PP preparative composition".

Example 1

A dry blend (resin for an L1 layer) of 60 parts by mass of EVOLUE™ SP2040 and 40 parts by mass of a PP preparative composition, and PRIME POLYPRO™ F107 (resin for an L2 layer) were each put into a hopper of a coextruder (multilayer cast molding machine, manufactured by Sumitomo Heavy Industries Modern, Ltd.) in which a T-die with a lip width of 1 mm had been installed. In addition, the cylinder temperature and the die temperature were set to 240° C. and 250° C., respectively, a melt-kneaded product was coextruded from the T die and cast-molded to obtain a two-layer sheet comprised of an L1 layer having a thickness of 150 μm and an L2 layer having a thickness of 150 μm.

A boundary between the L1 layer and the L2 layer of the two-layer sheet was notched with a cutter knife, an interface thereof was partially peeled, and an interlayer adhesive strength (interlayer strength) was measured with a peel tester. The strength at a time of the partial peeling of the interface (organoleptic test) was classified on the basis of the following criteria, and thus, the adhesive strength was A.

A heat history was imparted to the two-layer sheet at 160° C. for 10 minutes, and the sheet was slowly cooled to room temperature and then subjected to the same peel test. As a result, the adhesive strength was B. These results are shown in Table 1.

[Evaluation Criteria of Interlayer Strength in Peel Test]

A: The interlayer strength is too strong to perform partial peeling for carrying out a peel test.

B: A peel test can be carried out. The interlayer strength is very high.

C: A peel test can be carried out. The interlayer strength is high.

D: A peel test can be carried out. The interlayer strength is low.

Examples 2 to 9 and Comparative Examples 1 to 6

In the same manner as in Example 1 except for using the compositions shown in Tables 1 and 2 (the units of the numeral values in the tables are parts by mass), two-layer sheets were manufactured and evaluated. These results are shown in Tables 1 and 2.

INDUSTRIAL APPLICABILITY

The laminated sheet of the present invention has excellent adhesive strength between sheets and excellent heat resistance, as well as excellent adhesiveness to a non-polyolefin-based resin such as EVA and PET, and therefore, is suitably used for various packaging films and films for intermediate layers, and particularly for solar cell backsheets.

REFERENCE SIGNS LIST

10 L1 Layer
20 L2 Layer
30 Two-Layer sheet

The invention claimed is:

1. A laminated sheet comprising:
a two-layer sheet in which an L1 layer including 50 to 99 parts by mass of an ethylene-based polymer (E1) having a density of 890 to 970 kg/m$^3$ and 1 to 50 parts by mass of a propylene-based polymer (P1) (in which

TABLE 1

| | Item | | Example 1 | Example 2 | Example 3 | Example 4 | Example 5 | Example 6 | Example 7 | Example 8 | Example 9 |
|---|---|---|---|---|---|---|---|---|---|---|---|
| Configuration of layer | L1 layer (150 μm) | SP2040 | 60 | — | — | 90 | 80 | 60 | — | — | — |
| | | SP1540 | — | 80 | 60 | — | — | — | 90 | 80 | 60 |
| | | PP preparative composition | 40 | 20 | 40 | 10 | 20 | 40 | 10 | 20 | 40 |
| | | A-4085S | — | — | — | — | — | — | — | — | — |
| | L2 layer (150 μm) | F107 | 100 | 100 | 100 | 90 | 80 | 60 | 90 | 80 | 60 |
| | | PP preparative composition | — | — | — | — | — | — | — | — | — |
| | | A-4085S | — | — | — | 10 | 20 | 40 | 10 | 20 | 40 |
| Interlayer strength | Immediately after cast molding | | A | A | A | A | A | A | A | A | A |
| | After heat treatment (160° C. × 10 min) | | B | B | A | B | A | A | B | A | A |

TABLE 2

| | Item | | Comparative Example 1 | Comparative Example 2 | Comparative Example 3 | Comparative Example 4 | Comparative Example 5 | Comparative Example 6 |
|---|---|---|---|---|---|---|---|---|
| Configuration of layer | L1 layer (150 μm) | SP2040 | 100 | 100 | — | — | 60 | — |
| | | SP1540 | — | — | 100 | 100 | — | 60 |
| | | PP preparative composition | — | — | — | — | — | — |
| | | A-4085S | — | — | — | — | 40 | 40 |
| | L2 layer (150 μm) | F107 | 100 | 60 | 100 | 60 | 100 | 100 |
| | | PP preparative composition | — | 40 | — | 40 | — | — |
| | | A-4085S | — | — | — | — | — | — |
| Interlayer strength | Immediately after cast molding | | A | A | A | A | A | A |
| | After heat treatment (160° C. × 10 min) | | D | C | D | C | C | C |

As clearly seen from the results of Tables 1 and 2, it is possible to increase the interlayer strength after the heat treatment, between the L1 layer and the L2 layer having a propylene-based polymer as a main component, by incorporating a specific propylene-based polymer into the L1 layer having an ethylene-based polymer as a main component. This interlayer strength can be further improved by incorporating a small amount of an ethylene-based polymer satisfying specific properties into the L2 layer.

the total of the component (E1) and the component (P1) is 100 parts by mass) is in contact with an L2 layer including 50 to 100 parts by mass of a propylene-based polymer (P2) and 0 to 50 parts by mass of an ethylene-based elastomer (E2) having a density of equal to or more than 850 kg/m$^3$ and less than 890 kg/m$^3$ (in which the total of the component (P2) and the component (E2) is 100 parts by mass),
wherein the propylene-based polymer (P1) includes a propylene-based elastomer (P1a) including a propylene-derived constitutional unit and an ethylene-derived constitutional unit and/or a constitutional unit derived from an α-olefin having 4 to 20 carbon atoms, and satisfying the following requirement (a-1):

(a-1) a melting point (Tm) as measured using a differential scanning calorimeter (DSC) is lower than 120° C. or the melting point (Tm) is not observed.

2. The laminated sheet according to claim 1, wherein the L1 layer includes 55 to 95 parts by mass of the ethylene-based polymer (E1) and 5 to 45 parts by mass of the propylene-based polymer (P1).

3. The laminated sheet according to claim 1, wherein the propylene-based elastomer (P1a) satisfies the following requirement (a-2):

(a-2) a melt flow rate (MFR) (230° C., under a load of 2.16 kg) is 0.1 to 500 g/10 min.

4. The laminated sheet according to claim 1, wherein the propylene-based elastomer (P1a) includes 51% to 90% by mole of the propylene-derived constitutional unit.

5. The laminated sheet according to claim 1, wherein the propylene-based elastomer (P1a) includes 7% to 24% by mole of the ethylene-derived constitutional unit.

6. The laminated sheet according to claim 1, wherein the propylene-based elastomer (P1a) includes 0% to 25% by mole of the constitutional unit derived from an α-olefin having 4 to 20 carbon atoms.

7. The laminated sheet according to claim 1, wherein the propylene-based elastomer (P1a) includes a propylene-derived constitutional unit, an ethylene-derived constitutional unit, and a constitutional unit derived from an α-olefin having 4 to 20 carbon atoms.

8. The laminated sheet according to claim 1, wherein the propylene-based polymer (P1) further includes a propylene-based polymer (P1b) satisfying the following requirements (b-1) and (b-2) in combination with the propylene-based elastomer (P1a):

(b-1) a melting point (Tm) as measured by a re-heating method using a differential scanning calorimeter (DSC) is 120° C. to 170° C.; and (b-2) a melt flow rate (MFR) (230° C., under a load of 2.16 kg) is 0.1 to 500 g/10 min.

9. The laminated sheet according to claim 1, wherein the L1 layer and/or the L2 layer further include(s) 0.1% to 30% by mass of inorganic particles with respect to the total mass of the respective layers.

10. The laminated sheet according to claim 1, wherein the L1 layer and/or the L2 layer further include(s) 0.005% to 5% by mass of one or more stabilizers selected from the group consisting of an ultraviolet ray absorber, a heat-resistant stabilizer, and a hindered amine type light stabilizer with respect to the total mass of the respective layers.

11. The laminated sheet according to claim 1, wherein an L3 layer including an engineering plastic is in contact with a surface of the L2 layer opposite to the L1 layer.

12. The laminated sheet according to claim 11, wherein the engineering plastic is polyethylene terephthalate, polybutylene terephthalate, or polyamide.

13. The laminated sheet according to claim 1, wherein an L4 layer including a propylene-based polymer (P3) having a melting point (Tm) as measured by differential scanning calorimetry (DSC) of 140° C. to 170° C. is in contact with a surface of the L2 layer opposite to the L1 layer.

14. The laminated sheet according to claim 13, wherein the L4 layer further includes 0.005% to 5% by mass of one or more stabilizers selected from the group consisting of an ultraviolet ray absorber, a heat-resistant stabilizer, and a hindered amine type light stabilizer with respect to the total mass of the L4 layer.

15. A solar cell backsheet formed by using the laminated sheet according to claim 1.

16. A solar cell formed by using the solar cell backsheet according to claim 15.

* * * * *